(12) United States Patent  
Yasumatsu et al.

(10) Patent No.: US 11,355,314 B2  
(45) Date of Patent: Jun. 7, 2022

(54) ION BEAM PROCESSING APPARATUS, ELECTRODE ASSEMBLY, AND METHOD OF CLEANING ELECTRODE ASSEMBLY

(71) Applicant: CANON ANELVA CORPORATION, Kawasaki (JP)

(72) Inventors: Yasushi Yasumatsu, Kawasaki (JP); Naoyuki Okamoto, Kawasaki (JP); Masashi Tsujiyama, Kawasaki (JP); Fumihito Suzuki, Kawasaki (JP)

(73) Assignee: CANON ANELVA CORPORATION, Kawasaki (JP)

( * ) Notice: Subject to any disclaimer, the term of this patent is extended or adjusted under 35 U.S.C. 154(b) by 0 days.

(21) Appl. No.: 17/123,883

(22) Filed: Dec. 16, 2020

(65) Prior Publication Data

US 2021/0104377 A1 Apr. 8, 2021

Related U.S. Application Data

(60) Division of application No. 16/210,633, filed on Dec. 5, 2018, now Pat. No. 10,879,040, which is a division (Continued)

(30) Foreign Application Priority Data

Apr. 19, 2013 (JP) .................................. 2013-088656

(51) Int. Cl.
*H01J 37/30* (2006.01)
*H01J 37/305* (2006.01)
(Continued)

(52) U.S. Cl.
CPC ............ *H01J 37/3053* (2013.01); *B08B 3/08* (2013.01); *H01J 27/024* (2013.01); *H01J 37/063* (2013.01);
(Continued)

(58) Field of Classification Search
CPC .......... B08B 3/08; H01J 37/024; H01J 37/063; H01J 37/08; H01J 37/3053; H01J 37/3171;
(Continued)

(56) References Cited

U.S. PATENT DOCUMENTS 4,898,557 A 2/1990 Engemann
6,250,070 B1 6/2001 Kreiner et al.
(Continued)

FOREIGN PATENT DOCUMENTS

JP 4-329249 A 11/1992
JP 5-94795 A 4/1993
(Continued)

OTHER PUBLICATIONS

"Chronological Scientific Tables 2001", Edited by National Astronomical Observatory of Japan, Maruzen Co., Ltd., 2000, p. 475 (3 pages).

(Continued)

*Primary Examiner* — Rodney G McDonald
(74) *Attorney, Agent, or Firm* — Venable LLP (57) ABSTRACT

Provided is an ion beam processing apparatus including an ion generation chamber, a processing chamber, and electrodes to form an ion beam by extracting ions generated in the ion generation chamber to the processing chamber. The electrodes includes a first electrode disposed close to the ion generation chamber and provided with an ion passage hole to allow passage of the ions, and a second electrode disposed adjacent to the first electrode and closer to the processing chamber than the first electrode is, and provided with an ion passage hole to allow passage of the ions. The apparatus also includes a power unit which applies different electric potentials to the first electrode and the second electrode, respectively, so as to accelerate the ions generated by an ion (Continued)

generator in the ion generation chamber. A material of the first electrode is different from a material of the second electrode.

1 Claim, 3 Drawing Sheets

Related U.S. Application Data of application No. 14/878,206, filed on Oct. 8, 2015, now Pat. No. 10,224,179, which is a continuation of application No. PCT/JP2013/007269, filed on Dec. 10, 2013.

(51) Int. Cl.
*H01J 27/02* (2006.01)
*H01J 37/08* (2006.01)
*B08B 3/08* (2006.01)
*H01J 37/063* (2006.01)
*H01J 37/317* (2006.01)

(52) U.S. Cl.
CPC .......... *H01J 37/08* (2013.01); *H01J 37/3171* (2013.01); *H01J 2237/022* (2013.01); *H01J 2237/061* (2013.01); *H01J 2237/083* (2013.01); *H01J 2237/0815* (2013.01); *H01J 2237/3151* (2013.01)

(58) Field of Classification Search
CPC .......... H01J 2237/022; H01J 2237/061; H01J 2237/0815; H01J 2237/083; H01J 2237/3151
USPC ..................................... 204/298.36
See application file for complete search history.

(56) References Cited

U.S. PATENT DOCUMENTS

| | | |
|---|---|---|
| 6,514,390 B1 | 2/2003 | Xu et al. |
| 6,935,269 B2 | 8/2005 | Lee et al. |
| 8,378,576 B2 | 2/2013 | Abarra et al. |
| 2003/0168011 A1 | 9/2003 | Lee et al. |
| 2005/0242293 A1 | 11/2005 | Benveniste |
| 2015/0287567 A1 | 10/2015 | Tsujiyama et al. |

FOREIGN PATENT DOCUMENTS

| | | |
|---|---|---|
| JP | 5-290749 A | 11/1993 |
| JP | 9-259779 A | 10/1997 |
| JP | 10-130834 A | 5/1998 |
| JP | 2000-182526 A | 6/2000 |
| JP | 2000-340127 A | 12/2000 |
| JP | 2001-6590 A | 1/2001 |
| JP | 2001-312974 A | 11/2001 |
| JP | 2003-201957 A | 7/2003 |
| JP | 2003-533022 A | 11/2003 |
| JP | 2006-4826 A | 1/2006 |
| JP | 2006-515108 A | 5/2006 |
| JP | 2009-129611 A | 6/2009 |
| JP | 2010-118290 A | 5/2010 |
| JP | 2011-124215 A | 6/2011 |
| JP | 2011-129270 A | 6/2011 |
| JP | 2012-156077 A | 8/2012 |
| JP | 2013-115012 A | 6/2013 |

OTHER PUBLICATIONS

"P. G. Pyrolytic Graphite", Tomoe Engineering Co. Ltd., 2013 (2 pages) (URL: http://www.tomo-e.co.jp/cmsfiles/product/i-707724-r1.pdf).
"Iron-nickel Alloy", Hitachi Metals, Ltd., 2013 (1 page) (URL: http://www.hitachi-metals.co.jp/prod/prod01/pdf/hando_bra.pdf).
International Search Report in PCT/JP2013/007269, dated Jan. 21, 2014 (2 pages).
Machine Translation of JP 09-259779 (1997).

NON-IRRADIATION

FIG. 3B

IRRADIATION

ION BEAM PROCESSING APPARATUS, ELECTRODE ASSEMBLY, AND METHOD OF CLEANING ELECTRODE ASSEMBLY

CROSS-REFERENCES TO RELATED APPLICATIONS

This application is a divisional application of U.S. patent application Ser. No. 16/210,633, filed Dec. 5, 2018, which is a divisional application of U.S. patent application Ser. No. 14/878,206, filed Oct. 8, 2015, which is a continuation application of International Application No. PCT/JP2013/007269, filed Dec. 10, 2013, which claims the benefit of Japanese Patent Application No. 2013-088656 filed Apr. 19, 2013. The contents of the aforementioned applications are incorporated herein by reference in their entireties.

TECHNICAL FIELD

The present invention relates to an ion beam processing apparatus, an electrode assembly, and a method of cleaning an electrode assembly.

BACKGROUND ART

Processing using an ion beam is performed in manufacturing of various electronic components and the like. In particular, an ion implantation apparatus for implanting an impurity into semiconductor, an ion beam etching apparatus (hereinafter abbreviated as an IBE apparatus) configured to process a substrate by irradiating the substrate with an ion beam, and the like are widely used. Such an ion beam processing apparatus includes: an ion generation chamber being configured to generate plasma and thus serving as an ion source; a processing chamber in which a substrate is mounted on a holder and is subjected to processing; and an electrode assembly provided between the ion generation chamber and the processing chamber and configured to extract ions. The electrode assembly includes three electrodes each provided with numerous ion passage holes, and is known to use Mo (molybdenum), which is excellent in heat resistance and sputtering resistance, as the material thereof (see Patent Document 1).

CITATION LIST

Patent Document

Patent Document 1: Japanese Patent Application Laid-Open No. 2010-118290

Non Patent Documents

Non Patent Document 1: "Chronological Scientific Tables 2001", p. 475, Edited by National Astronomical Observatory of Japan, Published on Nov. 30, 2000 by Maruzen Co., Ltd.
Non Patent Document 2: "P. G. Pyrolytic Graphite", (online), Tomoe Engineering Co. Ltd., (Searched on Apr. 9, 2013) on the Internet (URL: http://www.tomo-e.co.jp/cms-files/product/i-707724-rl.pdf)
Non Patent Document 3: "Iron-nickel Alloy", (online), Hitachi Metals, Ltd., (Searched on Apr. 6, 2013) on the Internet (URL: http://www.hitachi-metals.co.jp./prod/prod01/pdf/hando_bra.pdf)

SUMMARY OF INVENTION

As described in Patent Document 1, the electrode assembly in the IBE apparatus includes at least three electrodes, namely, a first electrode to which a positive voltage is applied, a second electrode to which a negative voltage is applied, and a third electrode at ground potential. Here, each of these electrodes is known to use Mo as its material.

When a substrate is subjected to etching with an ion beam by using the above-described IBE apparatus, ions flowing out of the plasma in the ion generation chamber to the electrode assembly are accelerated by a voltage difference between the first electrode and the second electrode. The accelerated ions pass through the ion passage holes provided in the electrodes included in the electrode assembly, and are thus emitted as an ion beam into the processing chamber. However, part of the accelerated ions cannot pass through the ion passage holes, and therefore collide with the second electrode while retaining large energy. For this reason, portions around the ion passage holes of the second electrode are significantly etched, in particular, in association with the use of the IBE apparatus. At this time, the substance of the second electrode scattered from the second electrode mainly adheres to a portion of the first electrode facing the second electrode (the portion not facing the plasma).

Such an adhering matter to the first electrode can be removed by cleaning. However, since the material of the first electrode is the same as the material of the second electrode in the conventional apparatus, there is strong adhesion between the first electrode and the substance scattered from the second electrode and adhering onto the first electrode, and it is therefore difficult to detach this adhering matter in a cleaning process. Moreover, since the first electrode and the second electrode are made of the same material, it is not possible to selectively remove the adhering matter by utilizing reactivity in the cleaning process. Instead, the adhering matter needs to be removed by a physical processing method such as blasting. When the removal by the physical method is performed, a mechanical force is applied to the electrode. As a consequence, the electrode is deformed by the repetition of the cleaning process. Accordingly, there is also a problem that the life of the electrode is reduced and it is difficult to use the electrode repeatedly.

The present invention has been made in view of the above-mentioned problems. The conventional ion beam processing apparatus has the problem that the adhering matter containing the substance of the second electrode, to which the negative voltage is applied, adheres to the first electrode, to which the positive voltage is applied, in the case where the electrodes are included in the electrode assembly of the ion beam processing apparatus. In view of the above, it is an object of the present invention to provide an ion beam processing apparatus, an electrode assembly, and a method of cleaning an electrode assembly which are capable of selectively removing such an adhering matter by utilizing reactivity.

To attain the object, a first aspect of the present invention provides an ion beam processing apparatus configured to perform processing by ion beam irradiation, which includes: an ion generation chamber including an ion generator; a processing chamber in which the processing is performed and a holder to hold a substrate is disposed; multiple electrodes configured to separate the ion generation chamber from the processing chamber, and to form an ion beam by extracting ions generated in the ion generation chamber to the processing chamber, the multiple electrodes including a first electrode disposed close to the ion generation chamber and provided with an ion passage hole to allow passage of the ions, and a second electrode disposed adjacent to the first electrode and closer to the processing chamber than the first electrode is, and provided with an ion passage hole to allow passage of the ions; and a power unit configured to apply different electric potentials to the first electrode and the second electrode, respectively, so as to accelerate the ions generated by the ion generator in the ion generation chamber. Here, a material of the first electrode is different from a material of the second electrode, and a linear expansion coefficient $\alpha_1$ of the material of the first electrode and a linear expansion coefficient $\alpha_2$ of the material of the second electrode satisfy a relation of $\alpha_1 < \alpha_2$.

A second aspect of the present invention provides an ion beam processing apparatus configured to perform processing by ion beam irradiation, which includes: an ion generation chamber including an ion generator; a processing chamber in which the processing is performed and a holder to hold a substrate is disposed; multiple electrodes configured to separate the ion generation chamber from the processing chamber, and to form an ion beam by extracting ions generated in the ion generation chamber to the processing chamber, the multiple electrodes including a first electrode disposed close to the ion generation chamber and provided with an ion passage hole to allow passage of the ions, and a second electrode disposed adjacent to the first electrode and closer to the processing chamber than the first electrode is, and provided with an ion passage hole to allow passage of the ions; and a power unit configured to apply different electric potentials to the first electrode and the second electrode, respectively, so as to accelerate the ions generated by the ion generator in the ion generation chamber. Here, a material of the first electrode is different from a material of the second electrode. In addition, the ion beam processing apparatus further includes a third electrode disposed closer to the processing chamber than the second electrode is. Here, an electric potential, which is different from the electric potentials to be applied to the first electrode and the second electrode, is applied to the third electrode. Moreover, a material of the third electrode is different from the material of the second electrode.

A third aspect of the present invention provides an ion beam processing apparatus configured to perform processing by ion beam irradiation, which includes: an ion generation chamber including an ion generator; a processing chamber in which the processing is performed and a holder to hold a substrate is disposed; multiple electrodes configured to separate the ion generation chamber from the processing chamber, and to form an ion beam by extracting ions generated in the ion generation chamber to the processing chamber, the multiple electrodes including a first electrode disposed close to the ion generation chamber and provided with an ion passage hole to allow passage of the ions, and a second electrode disposed adjacent to the first electrode and closer to the processing chamber than the first electrode is, and provided with an ion passage hole to allow passage of the ions; and a power unit configured to apply different electric potentials to the first electrode and the second electrode, respectively, so as to accelerate the ions generated by the ion generator in the ion generation chamber. Here, a material of the first electrode is different from a material of the second electrode. The multiple electrodes include multiple flat plate electrodes. Here, each of the multiple flat plate electrodes includes numerous ion passage holes to allow passage of the ions. Moreover, positions of the ion passage holes in the flat plate electrodes and linear expansion coefficients of the materials of the flat plate electrodes are set such that, at the time of non-irradiation of the ion beam, each ion passage hole in one of the flat plate electrodes is located at such a position not coinciding with the corresponding ion passage hole in the other flat plate electrode in terms of a planar direction when viewed from a perpendicular direction, and at the time of irradiation of the ion beam, the ion passage hole in the one flat plate electrode moves from the position at the time of non-irradiation in such a direction to coincide with the corresponding ion passage hole in the other flat plate electrode in the planar direction by thermal expansion attributed to a rise in temperature.

A fourth aspect of the present invention provides a method of cleaning a first electrode included in an ion beam processing apparatus, which is configured to perform processing by ion beam irradiation, and provided with: an ion generation chamber including an ion generator; a processing chamber in which the processing is performed and a holder to hold a substrate is disposed; multiple electrodes configured to separate the ion generation chamber from the processing chamber, and to form an ion beam by extracting ions generated in the ion generation chamber to the processing chamber, the multiple electrodes including the first electrode disposed close to the ion generation chamber and provided with an ion passage hole to allow passage of the ions, and a second electrode disposed adjacent to the first electrode and closer to the processing chamber than the first electrode is, and provided with an ion passage hole to allow passage of the ions; and a power unit configured to apply different electric potentials to the first electrode and the second electrode, respectively, so as to accelerate the ions generated by the ion generator in the ion generation chamber. Moreover, a material of the first electrode is different from a material of the second electrode. Here, the method includes the steps of: preparing a cleaning agent having a rate to dissolve the material of the second electrode being higher than a rate to dissolve the material of the first electrode; and removing the material of the second electrode adhering to the first electrode from the first electrode by bringing the material of the second electrode into a reaction with the cleaning agent.

A fifth aspect of the present invention provides an electrode assembly included in the ion beam processing apparatus of the first aspect of the present invention and being a subject of the cleaning method of the fourth aspect of the present invention. The electrode assembly is configured to extract ions from an ion source and to form an ion beam, and includes: multiple electrodes, including a first electrode disposed on the ion source side and provided with an ion passage hole to allow passage of the ions, and a second electrode disposed on an opposite side of the first electrode from the ion source and provided with an ion passage hole to allow passage of the ions. Here, a material of the first electrode is different from a material of the second electrode.

A sixth aspect of the present invention provides an ion beam processing apparatus configured to perform processing by ion beam irradiation, which includes: an ion generation chamber including an ion generator; a processing chamber in which the processing is performed and a holder to hold a substrate is disposed; multiple electrodes configured to separate the ion generation chamber from the processing chamber, and to form an ion beam by extracting ions generated in the ion generation chamber to the processing chamber, the multiple electrodes including a first electrode disposed close to the ion generation chamber and provided with an ion passage hole to allow passage of the ions, and a second electrode disposed adjacent to the first electrode and closer to the processing chamber than the first electrode is, and provided with an ion passage hole to allow passage of the ions; and a power unit configured to apply different electric potentials to the first electrode and the second electrode, respectively, so as to accelerate the ions generated by the ion generator in the ion generation chamber. Here, a material of the first electrode is different from a material of the second electrode. Meanwhile, the first electrode contains titanium, and the second electrode contains pyrolytic graphite.

According to the ion beam processing apparatus, the cleaning method, and the electrode assembly of the present invention, it is possible to provide an ion beam processing apparatus, an electrode assembly, and a method of cleaning an electrode assembly which are capable of utilizing reactivity and thereby selectively removing an adhering matter in the case where the adhering matter containing a material of a second electrode, which is located closer to a processing chamber and adjacent to a first electrode that is located on an ion generation chamber side, adheres to the first electrode due to use of an ion beam processing apparatus.

DESCRIPTION OF EMBODIMENTS

An embodiment of the present invention will be described below with reference to the drawings. It is to be noted, however, that the present invention is not limited to this embodiment and various changes are possible within the scope not departing from the gist of the invention. It is to be also noted that in the following explanation made in conjunction with the drawings, portions having the same functions will be denoted by the same reference numerals and repetitive descriptions thereof may be omitted when appropriate.

Figure 1:
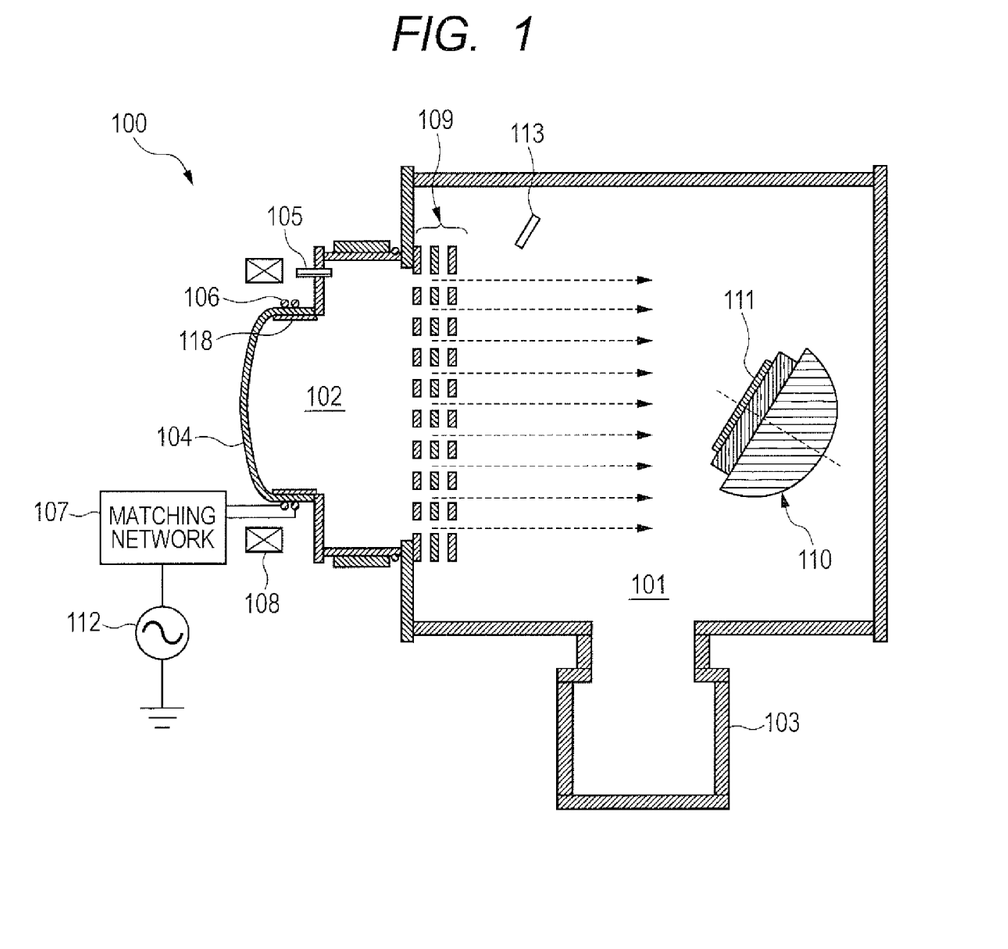
FIG. 1 is a schematic diagram of an IBE apparatus as an example of a processing apparatus according to an embodiment of the present invention.

FIG. 1 illustrates a schematic diagram of an IBE apparatus as an example of an ion beam processing apparatus of this embodiment. A configuration of the ion beam processing apparatus will be described.

An IBE apparatus 100 includes an ion generation chamber 102 and a processing chamber 101.

As a plasma formation system for forming plasma in the ion generation chamber 102, a bell jar (a discharge vessel) 104, a gas introduction part 105, and an antenna 106 that includes a conductive member and is configured to generate an induced magnetic field in the bell jar 104 are installed in the ion generation chamber 102. Outside the bell jar 104 there are also installed a discharge power unit 112 configured to supply high-frequency power (source power) to the antenna 106, a matching network 107 provided between the discharge power unit 112 and the antenna 106, and an electromagnetic coil 108. The bell jar 104 is part of a chamber external wall that keeps a vacuum in the ion generation chamber 102 as well as in the processing chamber 101, which is also a vessel to encapsulate the plasma generated by electric discharge. The high-frequency power supplied from the discharge power unit 112 is fed to the antenna 106, whereby the plasma is formed in the ion generation chamber 102 inside the bell jar 104.

The processing chamber 101 includes: a neutralizer 113 which neutralizes an ion beam; a substrate holder 110 serving as a holder to hold a substrate 111 which is a subject to be processed; and a vacuum pump 103 which removes the air inside the ion generation chamber 102 and the processing chamber 101 and keeps the inside in vacuum. A not-illustrated electrostatic chuck (ESC) electrode is connected to the substrate holder 110. By this ESC electrode, the substrate 111 mounted on the substrate holder 110 is fixed thereto by means of electrostatic attraction. Note that the substrate holder 110 only needs to have a function to fix the substrate and does not always have to utilize the electrostatic attraction attributed to the ESC electrode. Various substrate fixation methods, including one involving a clamp chuck, for example, can be used herein.

Figure 2:
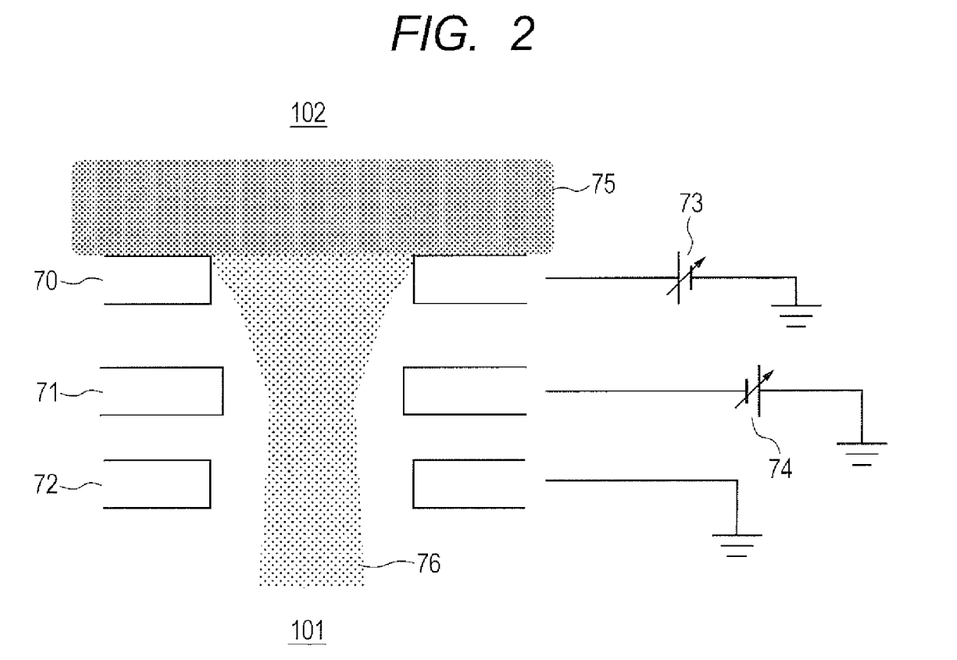
FIG. 2 is a schematic diagram of an electrode assembly constituting part of the IBE apparatus according to the embodiment of the present invention.

An electrode assembly 109 provided with ion passage holes for extracting ions is disposed at a boundary that separates the ion generation chamber 102 from the processing chamber 101. FIG. 2 illustrates a schematic diagram of the electrode assembly 109.

The electrode assembly 109 includes multiple pieces of flat plate electrodes each provided with a hole serving as the ion passage hole. Although one ion passage hole is illustrated on each of the flat plate electrodes in the drawing, numerous similar ion passage holes may by arranged instead. For example, numerous ion passage holes may be arranged in a matrix and in a grid (lattice) fashion. As illustrated in FIG. 2, the electrode assembly 109 includes a first electrode 70, a second electrode 71, and a third electrode 72 which are arranged from the ion generation chamber 102 side toward the processing chamber 101 side. Specifically, the first electrode 70 is disposed closest to the ion generation chamber side, i.e., an ion source side, while the second electrode 71 is disposed adjacent to the first electrode 70 and closer to the processing chamber 101 than the first electrode 70 is. Meanwhile, the third electrode 72 is disposed closest to the processing chamber 101. A voltage source 73 and a voltage source 74 are connected to the first electrode 70 and the second electrode 71, respectively, whereby a positive voltage is applied to the first electrode and a negative voltage is applied to the second electrode. Thus, a potential difference for accelerating the ions is generated between the first electrode and the second electrode. The third electrode 72 is electrically grounded. A diameter of the ion beam can be controlled within a predetermined range of numerical values using an electrostatic lens effect, by controlling a potential difference between the second electrode 71 and the third electrode 72.

An operation of ion beam irradiation using the IBE apparatus 100 will be described. First, a process gas containing an inert gas such as argon (Ar) is introduced from the gas introduction part 105 into the ion generation chamber 102. Next, the process gas inside the ion generation chamber 102 is ionized by applying a high-frequency wave from the discharge power unit 112 to the antenna 106, and the ion source is prepared by generating plasma 75 that contains the ions. The ions contained in the plasma 75 generated in the ion generation chamber 102 are accelerated by the potential difference provided between the first electrode 70 and the second electrode 71 when the ions pass through the numerous ion passage holes provided in the electrode assembly 109. Then, the ions are extracted as an ion beam 76 to the processing chamber 101. The ion beam is extracted to the processing chamber 101, and is then neutralized by the neutralizer 113 and emitted onto the substrate 111. Thus, a surface of the substrate 111 is subjected to etching.

As described previously, when the ions attempt to pass through the ion passage holes provided in the electrodes included in the electrode assembly 109, part of the accelerated ions cannot pass through the ion passage holes and collide with the second electrode while retaining large energy. For this reason, portions around the ion passage holes of the second electrode 71 are significantly etched, in particular, as the IBE apparatus 100 is used. At this time, the substance of the second electrode 71 scattered from the second electrode 71 mainly adheres to a portion of the first electrode 70 facing the second electrode 71 (the portion not facing the plasma 75). Such an adhering matter causes adverse effects on stability of the ion beam processing including a change in diameter of each ion passage hole in the first electrode 70, and the like. Therefore, the adhering matter needs to be removed regularly. For this reason, a cleaning process is performed on the electrode assembly 109 after the ion beam processing. Regarding details and cleaning of the electrode assembly 109, specific examples will be discussed below.

First Embodiment

In this embodiment, the material of the first electrode 70 is molybdenum (Mo) while the material of the second electrode 71 is titanium (Ti). It is to be noted that, in this embodiment, the description "the material of the first electrode 70 is Mo" does not intend to exclude elements other than Mo, compounds thereof, and the like. In this context, the first electrode 70 may contain components (elements, compounds, impurities, and the like) other than Mo as long as the first electrode 70 can fulfill the function to apply the positive voltage for accelerating the ions in the electrode assembly 109. In other words, in this embodiment, it is possible to say that the first electrode 70 contains Mo as its major component. In the meantime, the description "the material of the second electrode 71 is Ti" does not intend to exclude elements other than Ti, compounds thereof, and the like. In this context, the second electrode 71 may contain components (elements, compounds, impurities, and the like) other than Ti as long as the second electrode 71 can fulfill the function to apply the negative voltage for accelerating the ions in the electrode assembly 109. In other words, in this embodiment, it is possible to say that the second electrode 71 contains Ti as its major component.

It is to be noted that, when a description "a material of a certain electrode is a certain substance" is made in this specification, the description means that the certain electrode may also contain components (elements, compounds, impurities, and the like) other than the certain substance.

In this embodiment, when the ion beam processing is performed, the second electrode 71 may be etched by the ions extracted from the plasma 75 and Ti being the material of the second electrode 71 may be scattered by the etching. As a consequence of this scatter, Ti being the material of the second electrode 71 adheres to a surface of the first electrode 70 which uses Mo as its material. In the meantime, Ti has a property that its dissolution rate to a solution such as hydrofluoric acid is higher than that of Mo. Accordingly, Ti out of Mo and Ti is selectively dissolved by use of this property while cleaning the first electrode 70 by employing the solution such as hydrofluoric acid as a cleaning agent. As a consequence, Ti adhering to the first electrode 70 due to the etching of the second electrode 71 can be selectively removed. As described above, by forming the second electrode 71 from the material different from that of the first electrode 70, the adhering matter that adheres due to the ion beam processing can be removed by the selective etching. This makes it possible to conduct chemical processing without application of a mechanical force. Accordingly, the deformation of the electrode assembly 109, which has been a problem of conventional physical processing such as the blasting, is either reduced or eliminated. Hence, there is an advantage that the electrode assembly 109 has an extended product life and can be used repeatedly. In other words, it is possible to successfully remove the adhering matter originating from the second electrode 71 adhering to the first electrode 70, without cleaning the first electrode 70 by the physical method such as the blasting.

While the material of the second electrode 71 etched and scattered by the ion beam processing mainly adheres to the first electrode 70, part of the material also adheres to the third electrode 72. Accordingly, it is also preferable to form the third electrode 72 from a material different from that of the second electrode 71. Thus, as with the cleaning of the first electrode 70, the third electrode 72 can also be cleaned by use of a solution which is capable of selectively dissolving the adhering matter. Hence, the third electrode 72 can be cleaned easily. Furthermore, by forming the third electrode 72 from the same material as that of the first electrode 70, it is possible to clean the electrode assembly 109 by identical processing to that applicable to the first electrode 70. It is also possible to perform the cleaning simultaneously in order to simplify the process. To be more precise, the material of the first electrode 70 and the third electrode 72 may be Mo while the material of the second electrode 71 may be Ti, for example. Thus, it is possible to remove Ti adhering to the first electrode 70 and the third electrode 72 by using the hydrofluoric acid solution.

At this time, detachment of the adhering matter containing the substance of the second electrode 71 and adhering onto the first electrode 70 can be reduced by bringing a thermal expansion of the material of the first electrode 70 closer to a thermal expansion of the material of the second electrode 71. This point will be specifically discussed below.

The substance scattered from the second electrode 71 adheres mainly to a surface (a surface on the processing chamber 101 side) of the first electrode 70 on an opposite side from a surface in contact with the plasma 75. Here, the first electrode 70 in direct contact with the plasma 75 receives energy of the plasma 75. In other words, this side of the first electrode 70 is likely to be heated more than is the adhering matter, which is located on the surface of the first electrode 70 on the processing chamber 101 side and is therefore not in direct contact with the plasma 75. As a consequence, the first electrode 70 becomes higher in temperature than the adhering matter. For this reason, if the material of the first electrode 70 and the material of the second electrode 71, i.e., the material of the adhering matter have the same linear expansion coefficient, then the thermal expansion (=linear expansion coefficient×amount of rise in temperature) of the first electrode 70 becomes greater than that of the adhering matter.

Here, the linear expansion coefficient means a rate of change of length with respect to temperature per unit length, which is also referred to as a linear expansion rate, a thermal expansion rate, and so forth. The linear expansion coefficient is a constant unique to each material, and the linear expansion coefficient of each electrode is determined by deciding the material.

When the thermal expansion of the first electrode 70 is greater than the thermal expansion of the adhering matter that adheres to the first electrode 70, a large stress is applied to the adhering matter. If the stress applied to the adhering matter is large, the adhering matter may be detached and scattered from the first electrode 70, and may adhere to the substrate 111 and generate particles. Such particles may lead to occurrence of a defect such as disconnection in the production of semiconductor circuit elements in which fine patterns are formed.

Accordingly, in this embodiment, the linear expansion coefficient of the first electrode 70 is preferably set smaller than the linear expansion coefficient of the second electrode 71. Specifically, the linear expansion coefficient $\alpha_1$ of the first electrode 70 and the linear expansion coefficient $\alpha_2$ of the second electrode 71 preferably satisfy a relation of $\alpha_1 < \alpha_2$. In this way, the thermal expansion of the first electrode 70 is brought closer to the thermal expansion of the adhering matter adhering to the first electrode 70. Thus, the detachment of the adhering matter can be reduced by diminishing the stress applied thereto, and the particles that adhere to the substrate 111 are reduced as well.

As examples of combinations of the materials, if Mo is used for the first electrode 70, then any of Ti, a nickel-iron alloy (NiFe alloy), tungsten (W), tantalum (Ta), and the like is used as the second electrode 71. Meanwhile, when Ti is used for the second electrode 71, Mo or a carbon-based material such as pyrolytic graphite (PG) is used as the material of the first electrode 70. By selecting these materials as appropriate, it is possible to achieve the above-mentioned relation of the thermal expansions and thus to obtain the above-mentioned effect.

Table 1 describes values of the linear expansion coefficients as well as sputtering rates to be described later. Here, codes such as "*(1)" in the table represent the documents (Non Patent Documents 1 to 3) from which the values are cited.

TABLE 1

| Item | PG | Mo | W | Ta | Ti | NiFe alloy | Ni |
|---|---|---|---|---|---|---|---|
| Linear Expansion Coefficient ($10^{-6}$/K) | 0.6*(2) | 3.7–5.3*(1) | 4.5*(1) | 6.3*(1) | 8.6*(1) | 4.5–5.3*(3) | 13.4*(1) |
| Sputtering Rate (Ar 500 eV) | 0.12 | 0.80 | 0.57 | 0.57 | 0.51 | — | — | beam. Accordingly, PG is less scattered in the ion beam processing and an amount of deposition of the adhering matter to the first electrode 70 is reduced as well. As a consequence, a cleaning frequency or a replacement frequency of the electrode assembly 109 can be reduced.

As described above, it is possible to facilitate the cleaning of the first electrode 70 and to extend a replacement cycle thereof by forming the first electrode 70 and the second electrode 71 from the materials different from each other, and forming the second electrode 71 from the material having higher sputtering resistance than that of the first electrode 70. This makes it possible to reduce the number of steps as well as costs of maintenance.

Meanwhile, as with the first embodiment, it is preferable to form the third electrode 72 from a material different from that of the second electrode 71. Furthermore, it is preferable to form the third electrode 72 from the same material as that of the first electrode 70. To be more specific in the light of this embodiment, it is preferable to use Ti as the material of the first electrode 70, to use PG as the material of the second electrode 71, and to use Ti as the material of the third electrode 72. Thus, the third electrode 72 can be cleaned easily as with the first embodiment.

In this case, when the thermal expansion coefficient of Ti being the material of the first electrode 70 is compared with that of PG being the material of the second electrode 71, the thermal expansion coefficient of Ti is greater than that of PG. Accordingly, a difference in thermal expansion between the first electrode 70 and the second electrode 71 at the time of the ion beam processing may become larger than that in a case where the first electrode 70 and the second electrode 71 are made of the same substance. At this time, displacement of positions of the ion passage holes provided in the first electrode 70 and the second electrode 71 at the time of the ion beam processing due to the difference in thermal expansion may become a problem. In recent years, the area of the substrate 111 being a processing target has been increasing in order to improve manufacturing efficiency of electronic components and the like. Accordingly, the ion generation chamber 102 also needs to be increased in size, and there is a tendency that the first to third electrodes are required to have larger diameters as well. For this reason, the aforementioned displacement of the ion passage holes is more likely to be problematic.

To improve this problem, it is preferable to form the ion passage holes in the first electrode 70 and the second electrode 71 in such positions to take into account the thermal expansion in advance particularly in the case of a processing apparatus for a large-area substrate where the difference in thermal expansion between the first electrode 70 and the second electrode 71 may be problematic. Specifically, at the time of irradiation (FIG. 3B) of the ion beam, the ion passage holes in the respective electrodes should be designed to move from positions at the time of non-irradia-

Second Embodiment

Figure 3A:
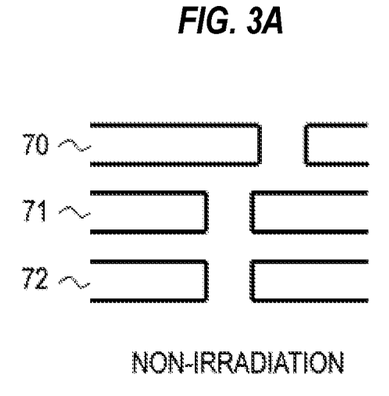
FIG. 3A and FIG. 3B are schematic diagrams of the ion passage holes in the respective electrodes at the time of non-irradiation (FIG. 3A) of the ion beam and at the time of irradiation (FIG. 3B) of the ion beam according to the second embodiment of the present invention.
Figure 3B:
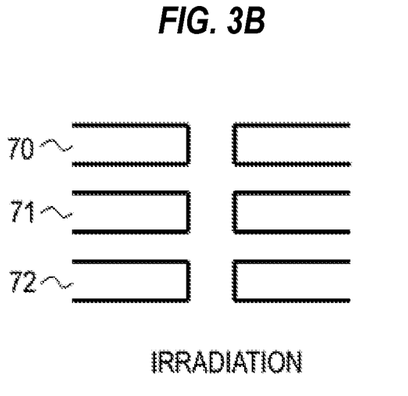

In this embodiment, the material of the first electrode 70 is Ti and the material of the second electrode 71 is PG. In this case, when the ion beam processing is performed, PG being the material of the second electrode 71 adheres to the surface of the first electrode 70 that uses Ti as the material. In the meantime, PG has a property that its dissolution rate to a solution such as concentrated sulfuric acid, concentrated nitric acid, and a mixed liquid thereof is higher than that of Ti. Accordingly, PG out of Ti and PG is selectively dissolved by use of this property while performing the cleaning by employing the solution such as concentrated sulfuric acid, concentrated nitric acid, and the mixed liquid thereof. Thus, the adhering PG can be removed. In this way, the adhering matter adhering to the first electrode 70 due to the ion beam processing can be removed by the selective etching. This exerts an effect of either reducing or eliminating the deformation of the electrode assembly 109 as with the first embodiment. Moreover, PG particularly has very high sputtering resistance (a sputtering resistance rate) against the ion tion (FIG. 3A) of the ion beam in such directions to coincide with one another in a planar direction (FIG. 3B) viewed from a perpendicular direction by the thermal expansion attributed to a rise in temperature. In addition, the positions of the respective ion passage holes may be set in consideration of the linear expansion coefficients of the materials. In this case, at the time of non-irradiation of the ion beam, i.e., at the time of non-operation, each ion passage hole in one of the electrodes may be located at such a position not completely coinciding with the corresponding ion passage hole in another one of the electrodes in terms of the planar direction (FIG. 3A).

Although the relation between the first electrode 70 and the second electrode 71 is mainly discussed in this description in order to simplify the description, it is also possible to design a relation between the second electrode 71 and the third electrode 72 likewise. Thus, a similar effect is obtained.

Third Embodiment

This embodiment is similar to the first embodiment in that the material of the first electrode 70 is Mo and the material of the second electrode 71 is Ti. Moreover, in this embodiment, at least part of the surface of the first electrode is coated (covered) with a material contained in the second electrode 71.

As described in the section of the first embodiment, when the material of the first electrode 70 is different from that of the second electrode 71, the substance adhering to the first electrode 70 is subjected to the stress attributed to the difference in thermal expansion. Due to this stress, there may be a problem that the substance adhering to the first electrode 70 is prone to detachment and thus leads to generation of the particles on the surface of the substrate 111. Accordingly, in the third embodiment to be discussed in this section, the first electrode 70 is coated in advance with the material contained in the second electrode 71. In this way, at the time of the irradiation of the ion beam, the substance of the second electrode 71 adheres as the adhering matter onto the first electrode 70 not directly but through the intermediary of the coated film. In this case, since the adhering matter and the coated film are of the same substance, the adhering matter adheres onto the coated film with high adhesion. In this embodiment, a Ti thin film is coated on Mo which is the material of the first electrode 70. Note that it is not always necessary to coat the entire surface of the first electrode 70. The coated film at least needs to be formed mainly in a region to which the etched substance of the second electrode 71 adheres, i.e., on the surface of the first electrode 70 opposed to the second electrode 71.

The coated film is formed by various methods. For example, the coated film is formed on the first electrode 70 by conducting various processing methods including CVD (chemical vapor deposition), PVD (physical vapor deposition), plating, thermal spraying, and the like. Particularly from the viewpoint of adhesion between a base material and a coated film, it is preferable to form the coated film by thermal spray processing which can bring about excellent adhesion.

When the coated electrode is cleaned, the adhering matter is selectively removed from the base material together with the coated film, and then another coated film is formed again by the thermal spray processing in order to enable the reuse. In this embodiment, for instance, Ti that adheres to the surface is removed simultaneously with Ti constituting the coated film by using the solution such as hydrofluoric acid as with the first embodiment, and then another Ti film is formed again by the thermal spray processing to enable the reuse.

As described in the first embodiment, a material having a smaller thermal expansion coefficient than that of the material of the second electrode 71 is preferably used as the material of the first electrode 70 in this embodiment as well, so as to obtain an effect similar to that of the first embodiment by reducing a difference between the thermal expansion of the first electrode 70 and the thermal expansions of the coated film as well as the adhering matter.

Although only the first electrode 70 and the second electrode 71 are discussed in this description in order to simplify the description, it is also possible to use Ti-coated Mo for the third electrode 72 as with the first electrode 70. Thus, a similar effect is obtained.

Fourth Embodiment

In this embodiment, the first electrode 70 in the second embodiment is changed from Ti to Mo. Specifically, in this embodiment, the material of the first electrode 70 is Mo and the material of the second electrode 71 is PG. This embodiment can also obtain an effect similar to that of the second embodiment. When the ion beam processing is performed, PG being the material of the second electrode 71 adheres onto the first electrode 70 that uses Mo as the material. As with the aforementioned embodiments, such an adhering matter can be removed by the selective etching.

Fifth Embodiment

In this embodiment, the material of the first electrode 70 is Mo and the material of the second electrode 71 is also Mo. However, at least part of the surface of the first electrode 70 is coated with nickel (Ni). In this way, at the time of the ion beam processing, the adhering matter is formed on the coated film as with the third embodiment. As a consequence, it is possible to obtain an effect similar to that of the third embodiment even though the major material of the first electrode 70 is the same as that of the second electrode 71. In addition, Ni has a property that its adhesion to Mo is fine. Hence, there is an advantage that the adhering matter is less likely to be detached.

When the first electrode 70 is cleaned, a ferric chloride solution can be used as a method of selectively etching the Ni coated film off Mo. Procedures other than the selective etching, such as the coating can be conducted in a similar manner to the third embodiment.

Although only the first electrode 70 and the second electrode 71 are mainly discussed in this description in order to simplify the description, it is also possible to use the Ni-coated Mo for the third electrode 72 as with the first electrode 70. Thus, a similar effect is obtained.

Sixth Embodiment

In this embodiment, the material contained in the second electrode in the fifth embodiment is changed from Mo to PG. Specifically, the material of the first electrode 70 is Mo and the material of the second electrode 71 is PG. However, at least part of the surface of the first electrode 70 is coated with nickel (Ni). In this way, as with the third embodiment, the adhering matter is formed on the coated film at the time of the ion beam processing. Thus, an effect similar to those of the third to fifth embodiments can be obtained. Meanwhile, as discussed in the section of the second embodiment, PG has very high sputtering resistance against the ion beam as compared to Mo, whereby an amount of deposition of the adhering matter to the first electrode 70 is reduced. As a consequence, it is possible to obtain an additional effect that a cleaning frequency or a replacement frequency of the electrode assembly 109 can be further reduced.

Although only the first electrode 70 and the second electrode 71 are mainly discussed in this description in order to simplify the description, it is also possible to use the Ni-coated Mo for the third electrode 72 as with the first electrode 70. Thus, a similar effect is obtained.

Seventh Embodiment

In this embodiment, the material of the first electrode 70 is PG, the material of the second electrode 71 is Mo, and the material of the third electrode 72 is Ti. This embodiment can also obtain an effect similar to that of the first embodiment. Here, when the first electrode 70 is cleaned, a mixed solution of hydrofluoric acid and nitric acid can be used as a method of selectively etching Mo being the adhering matter off the first electrode 70 using PG as its material.

OTHER EMBODIMENTS

Although the ion beam etching is explained in the above-described embodiments as the ion beam processing, the present invention is applicable to other aspects as long as the aspects adopt processing using an ion beam, such as ion implantation.

As described above in the embodiments, the first electrode 70 and the second electrode 71 provided in the electrode assembly 109 of the IBE apparatus 100 are made from the materials different from each other. Thus, the material of the second electrode 71 that adheres onto the first electrode 70 due to the ion beam processing can be easily cleaned and removed by the selective etching that uses a solution having a rate to dissolve the second electrode 71 which is higher than a rate to dissolve the first electrode 70. In this way, it is possible to perform chemical processing by utilizing reactivity without application of a mechanical force, and the deformation of the electrode assembly 109, which has been a problem of the conventional physical processing such as the blasting, is either reduced or eliminated as a consequence. Accordingly, the product life of the electrode assembly 109 is extended and the effect of reusability can be thus obtained.

What is claimed is:

1. An ion beam processing apparatus configured to perform processing by ion beam irradiation, comprising:
an ion generation chamber including an ion generator;
a processing chamber in which the processing is performed and a holder to hold a substrate is disposed;
a plurality of electrodes configured to separate the ion generation chamber from the processing chamber, and to form an ion beam by extracting ions generated in the ion generation chamber to the processing chamber, the plurality of electrodes including:
a first electrode disposed close to the ion generation chamber and provided with an ion passage hole to allow passage of the ions, and
a second electrode disposed adjacent to the first electrode and closer to the processing chamber than the first electrode is, and provided with an ion passage hole to allow passage of the ions; and
a power unit configured to apply different electric potentials to the first electrode and the second electrode, respectively, so as to accelerate the ions generated by the ion generator in the ion generation chamber,
wherein a material of the first electrode is different from a material of the second electrode,
wherein the plurality of electrodes comprise a plurality of flat plate electrodes,
wherein each of the plurality of flat plate electrodes includes numerous ion passage holes to allow passage of the ions, and
wherein positions of the ion passage holes in the flat plate electrodes and linear expansion coefficients of the materials of the flat plate electrodes are set such that:
at the time of non-irradiation of the ion beam, each ion passage holes in one of the flat plate electrodes is located at such a position not coinciding with the corresponding ion passage holes in one of an other of the flat plate electrodes in terms of a planar direction when viewed from a perpendicular direction, and
at the time of irradiation of the ion beam, the ion passage holes in the one of the flat plate electrodes moves from the position at the time of non-irradiation in such a direction to coincide with the corresponding ion passage holes in the one of the other of the flat plate electrodes in the planar direction by thermal expansion attributed to a rise in temperature.

* * * * *